United States Patent
Cho et al.

(10) Patent No.: US 9,934,959 B2
(45) Date of Patent: Apr. 3, 2018

(54) METHOD AND APPARATUS FOR PURIFYING CLEANING AGENT

(71) Applicant: SAMSUNG ELECTRONICS CO., LTD., Gyeonggi-do (KR)

(72) Inventors: Yong-Jhin Cho, Gyeonggi-do (KR); Jung-Min Oh, Incheon (KR); Yongmyung Jun, Gyeonggi-do (KR); Yongsun Ko, Gyeonggi-do (KR); Kuntack Lee, Gyeonggi-do (KR); Hyosan Lee, Gyeonggi-do (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 573 days.

(21) Appl. No.: 14/537,318

(22) Filed: Nov. 10, 2014

(65) Prior Publication Data

US 2015/0157955 A1 Jun. 11, 2015

(30) Foreign Application Priority Data

Dec. 5, 2013 (KR) .................. 10-2013-0150774

(51) Int. Cl.
*H01L 21/02* (2006.01)

(52) U.S. Cl.
CPC .. *H01L 21/02101* (2013.01); *H01L 21/02057* (2013.01)

(58) Field of Classification Search
CPC ............ H01L 21/02101; H01L 21/02057
See application file for complete search history.

(56) References Cited

U.S. PATENT DOCUMENTS

| 4,923,493 A * | 5/1990 | Valencia ............... F25J 3/0209 62/629 |
| 5,908,510 A * | 6/1999 | McCullough ......... B08B 7/0021 134/2 |
| 6,558,475 B1 * | 5/2003 | Jur ....................... B08B 7/0021 134/18 |
| 6,870,060 B1 | 3/2005 | Cochran et al. |
| 6,889,508 B2 | 5/2005 | Leitch et al. |
| 7,018,444 B2 | 3/2006 | Billingham et al. |
| 2003/0161780 A1 | 8/2003 | Howard et al. |

(Continued)

FOREIGN PATENT DOCUMENTS

| JP | 2006279037 | 10/2006 |
| JP | 2012049446 | 3/2012 |

(Continued)

*Primary Examiner* — Brian A McCaig
(74) *Attorney, Agent, or Firm* — F. Chau & Associates, LLC

(57) ABSTRACT

A method of purifying a cleaning agent is provided. The method includes heating a first mixed solution including an etching agent, a first cleaning agent, and a second cleaning agent at or below a first temperature and distilling the etching agent and the first cleaning agent and removing the second cleaning agent. The method includes condensing or compressing the etching agent and the first cleaning agent forming a second mixed solution including the etching agent and the first cleaning agent. The method includes heating the second mixed solution at a temperature lower than a second temperature, redistilling the etching agent and extracting the first cleaning agent. The second temperature is lower than the first temperature.

13 Claims, 6 Drawing Sheets

(56) References Cited

U.S. PATENT DOCUMENTS

2006/0213820 A1 9/2006 Bertram et al.
2012/0048304 A1 3/2012 Kitajima et al.

FOREIGN PATENT DOCUMENTS

| KR | 1020040101666 | 12/2004 |
| KR | 1020060059408 | 6/2006 |
| KR | 1020090085247 | 8/2009 |
| KR | 1020120113971 | 10/2012 |
| KR | 1020130007397 | 1/2013 |

\* cited by examiner

METHOD AND APPARATUS FOR PURIFYING CLEANING AGENT

CROSS-REFERENCE TO RELATED APPLICATION

This U.S. non-provisional patent application claims priority under 35 U.S.C. § 119 to Korean Patent Application No. 10-2013-0150774, filed on Dec. 5, 2013, in the Korean Intellectual Property Office, the disclosure of which is incorporated by reference herein in its entirety.

TECHNICAL FIELD

Exemplary embodiments of the present inventive concept relate to a method and an apparatus for purifying a cleaning agent.

DISCUSSION OF RELATED ART

Cleaning agents are commonly used to physically or chemically treat spaces between fine patterns. High density semiconductor devices that are not well cleaned or are cleaned with unpure agents can result in low yield and unreliable devices. However, pure cleaning agents can be costly.

SUMMARY

Exemplary embodiments of the present inventive concept may be directed to a method and apparatus for purifying a cleaning agent.

Exemplary embodiments of the present inventive concept provide a method of purifying a cleaning agent. The method includes heating a first mixed solution including an etching agent, a first cleaning agent, and a second cleaning agent at or below a first temperature and distilling the etching agent and the first cleaning agent and removing the second cleaning agent. The method includes condensing or compressing the etching agent and the first cleaning agent forming a second mixed solution including the etching agent and the first cleaning agent. The method includes heating the second mixed solution at a temperature lower than a second temperature, redistilling the etching agent and extracting the first cleaning agent. The second temperature is lower than the first temperature.

The first cleaning agent may include a supercritical fluid. The supercritical fluid may include carbon dioxide.

The etching agent may include a wet etching agent or dry etching agent. Boiling points of the wet etching agent and the dry etching agent may be lower than that of the supercritical fluid.

The wet etching agent may include hydrobromic acid.

The dry etching agent may include phosphine, germane, methane, diborane, or nitrogen tri-fluoride.

The second cleaning agent may include a wet cleaning agent having a boiling point higher than that of the supercritical fluid. The wet cleaning agent may include an organic solvent.

The organic solvent may include isopropyl alcohol.

The method may include heating the second mixed solution at or below the first temperature and distilling the etching agent and the first cleaning agent of the second mixed solution and removing the second cleaning agent when the second cleaning agent remains in the second mixed solution.

The first temperature may be lower than a boiling point of the second cleaning agent.

The second temperature may be a boiling point of the first cleaning agent.

Exemplary embodiments of the present inventive concept provide an apparatus for purifying a cleaning agent. The apparatus includes a first distillation tower configured to heat a first mixed solution including an etching agent, a first cleaning agent, and a second cleaning agent to distill the etching agent and the first cleaning agent and to remove the second cleaning agent. A compressor is disposed at a back side of the first distillation tower. The compressor is configured to condense the first cleaning agent and the etching agent to form a second mixed solution. A second distillation tower may be disposed at a back side of the compressor. The second distillation tower is configured to heat the second mixed solution to distill the etching agent and to extract the first cleaning agent.

The apparatus may further include a main purification pipe connecting the first distillation tower, the compressor, and the second distillation tower to each other. The main purification pipe may include a first main pipe connected to a lower portion of the first distillation tower and the compressor. The main purification pipe may include a second main pipe connected to the compressor and a lower portion of the second distillation tower.

The apparatus may include a reflux pipe connected to the second main pipe and the lower portion of the first distillation tower. The reflux pipe may be configured to convey a portion or an entire portion of the second mixed solution to the first distillation tower.

The apparatus may include a reflux control valve disposed on the reflux pipe. The reflux control valve may be configured to switch a flow direction of the second mixed solution. The reflux control valve may be configured to be turned-on when the second cleaning agent remains in the second mixed solution.

The apparatus may include a buffer tank disposed at a front side of the first distillation tower. The buffer tank may be configured to store the first mixed solution. An absorption unit may be disposed at a back side of the second distillation tower. The absorption unit may be configured to remove impurities from the first cleaning agent. The main purification pipe may further include a third main pipe connected to a lower portion of the buffer tank and the lower portion of the first distillation tower. The third main pipe may be configured to convey the first mixed solution to the first distillation tower. The main purification pipe may further include a fourth main pipe connected to the lower portion of the second distillation tower and the absorption unit. The fourth main pipe may be configured to convey the first cleaning agent to the absorption unit.

BRIEF DESCRIPTION OF THE DRAWINGS

The above and other features of the inventive concept will become more apparent by describing in detail exemplary embodiments thereof, with reference to the accompanying drawings, in which.

DETAILED DESCRIPTION OF THE EMBODIMENTS

Figure 1:
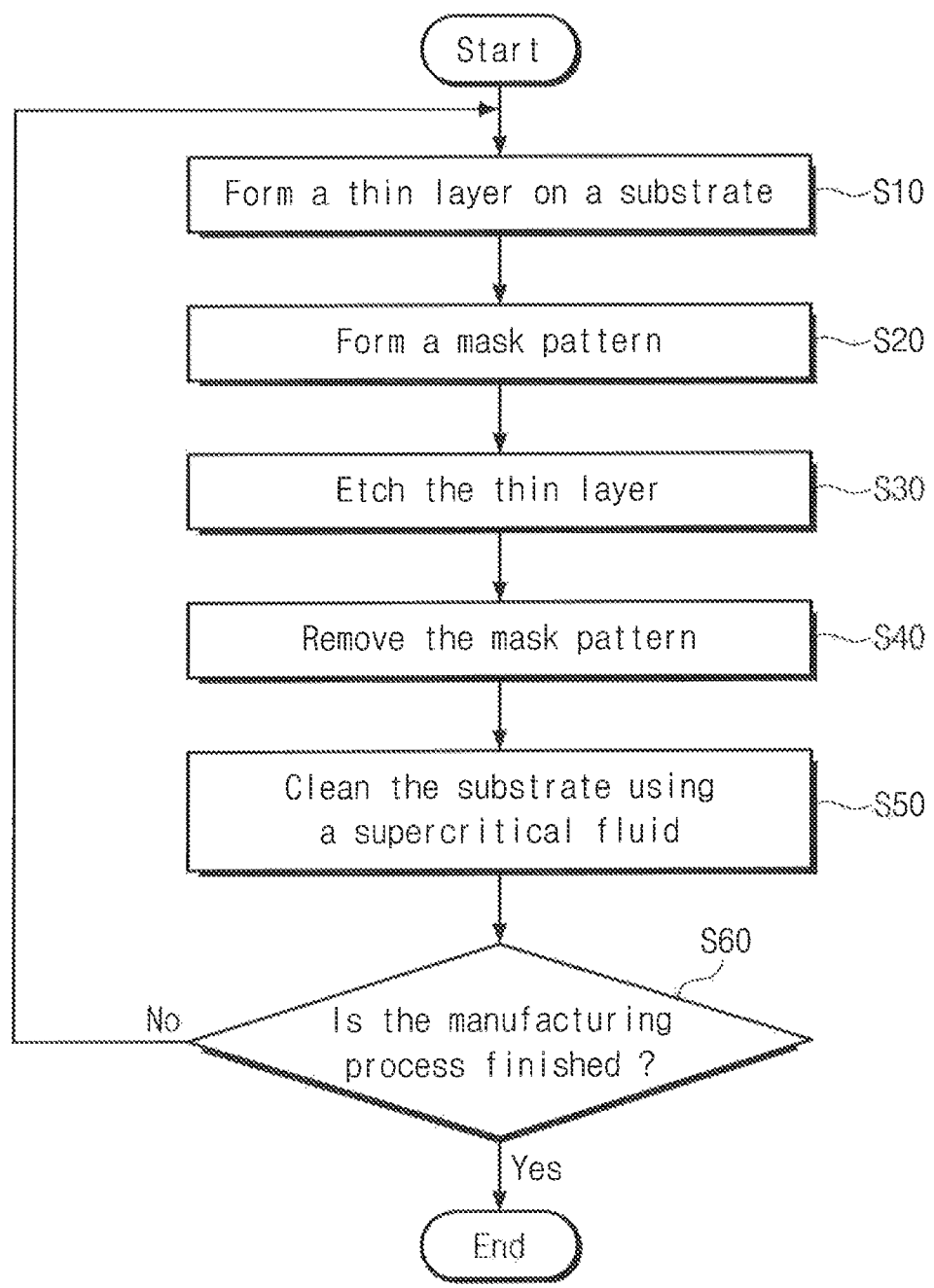
FIG. 1 is a flowchart illustrating a method of manufacturing a substrate according to exemplary embodiments of the present inventive concept.

Exemplary embodiments of the present inventive concept will now be described more fully hereinafter with reference to the accompanying drawings, in which some exemplary embodiments are shown. It should be noted, however, that the present inventive concept is not limited to the exemplary embodiments set forth herein.

It will be understood that when an element is referred to as being "connected" or "coupled" to another element, it may be directly connected or coupled to the other element or intervening elements may be present.

The same reference numerals or the same reference designators may refer to the same elements throughout the specification and drawings.

FIG. 1 is a flowchart illustrating a method of manufacturing a substrate according to exemplary embodiments of the present inventive concept. FIGS. 2 to 5 are cross-sectional views illustrating a method of manufacturing the substrate of FIG. 1.

Figure 2:
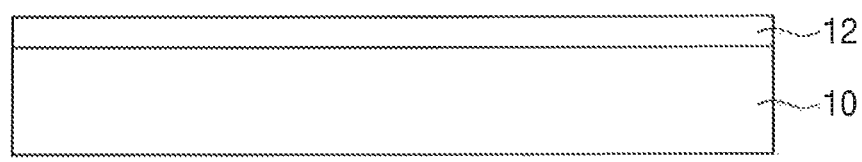
FIGS. 2 to 5 are cross-sectional views illustrating a method of manufacturing the substrate of FIG. 1.

Referring to FIGS. 1 and 2, a thin layer 12 may be formed on a substrate 10 (S10). The substrate 10 may include a silicon wafer. According to exemplary embodiments of the present inventive concept, the thin layer 12 may be formed by a physical vapor deposition (PVD) method or a chemical vapor deposition (CVD) method. The thin layer 12 may include, for example, single-crystalline silicon, poly-crystalline silicon, or a silicon compound (e.g., silicon oxide, silicon nitride, or silicon oxynitride). The thin layer 12 may include a metal layer or a metal oxide layer.

Figure 3:
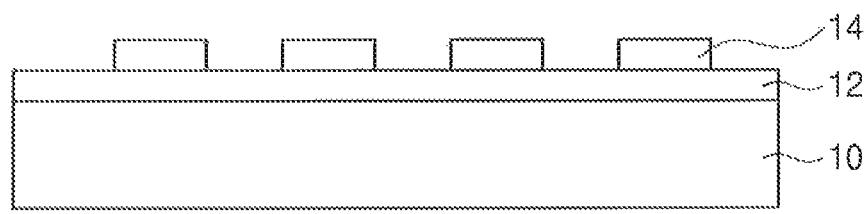
Figure 4:
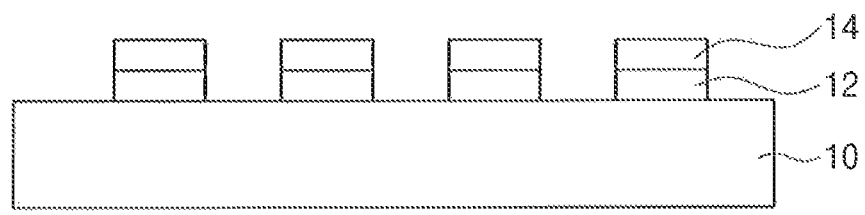

Referring to FIGS. 1 and 3, a mask pattern 14 may be formed on the thin layer 12 (S20). The mask pattern 14 may be formed by a photolithography process. A photoresist pattern may be formed on the substrate 10 or the thin layer 12 by the photolithography process. The mask pattern 14 may be the photoresist pattern.

Referring to FIGS. 1 and 3, the thin layer 12 exposed by the mask pattern 14 may be etched (S30). The thin layer 12 may be etched by a wet etching method or a dry etching method.

The substrate 10 or the thin layer 12 may be isotropically etched by the wet etching method. According to exemplary embodiments of the present inventive concept, an etching agent used in the wet etching method may include an acid solution. For example, the etching agent of the wet etching method may include hydrobromic acid (HBr), a LAL solution, or a standard clean 1 (SC1) solution. The LAL solution and the SC1 solution may include hydrofluoric acid (HF).

The substrate 10 or the thin layer 12 may be anisotropically etched by the dry etching method. For example, a cleaning agent of the dry etching method may include phosphine ($PH_3$), germane ($GeH_4$), methane ($CH_4$), diborane ($B_2H_6$), or nitrogen tri-fluoride ($NF_3$). The nitrogen tri-fluoride ($NF_3$) may etch the substrate 10 or the thin layer 12 by a remote plasma method.

Figure 5:
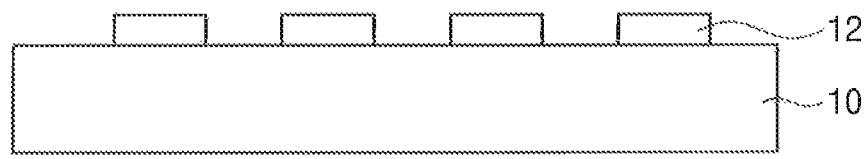

Referring to FIGS. 1 and 5, the mask pattern 14 may be removed and the substrate may be cleaned (S10). The mask pattern 14 may be removed by a wet cleaning method using a wet cleaning agent (e.g., an organic solvent). The organic solvent may include ether, acetone, ethanol, methanol, or isopropyl alcohol.

The substrate 10 may be cleaned using a supercritical fluid (S50). The supercritical fluid may remove the etching agent and the wet cleaning agent remaining on the substrate 10 and thin layer 12. The supercritical fluid may be a final cleaning agent for cleaning the wet cleaning agent and the etching agent. The supercritical fluid may include carbon dioxide in a supercritical state. The carbon dioxide may have both liquid properties and gas properties at high temperature and high pressure.

Figure 6:
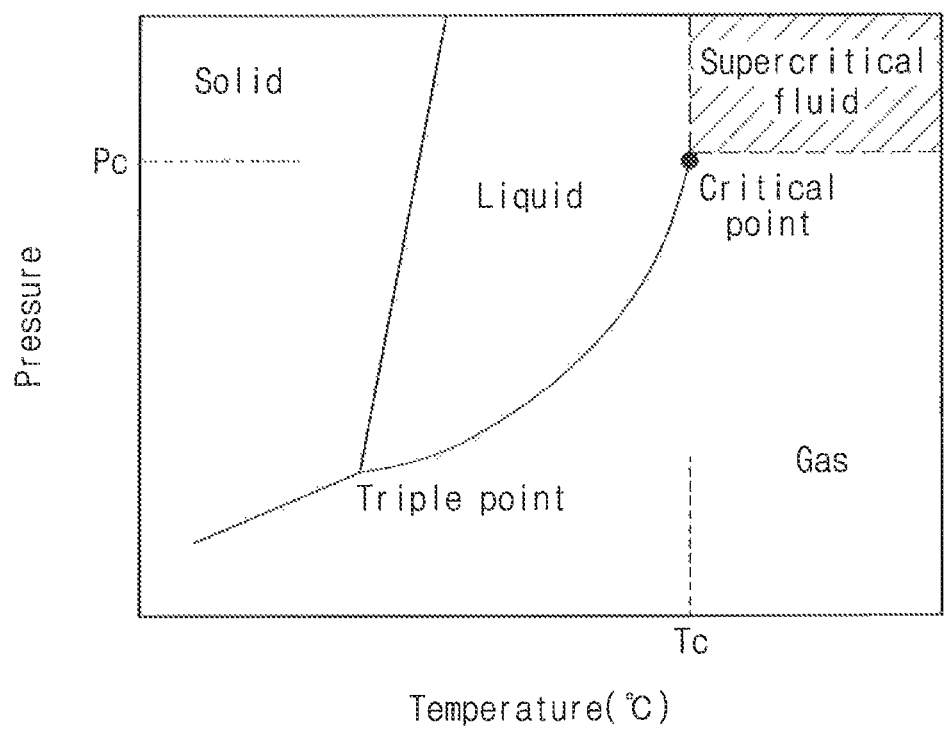
FIG. 6 is a graph illustrating a supercritical fluid state of carbon dioxide.

FIG. 6 is a graph illustrating a supercritical fluid state of carbon dioxide.

Referring to FIG. 6, carbon dioxide may have a supercritical fluid state at a temperature of a critical temperature Tc or higher and a pressure of a critical pressure Pc or higher. The supercritical fluid may include a material in a state in which distinct liquid and gas phases do not exist. For example, carbon dioxide may have the supercritical fluid state at a temperature equal to or greater than the critical temperature Tc of about 31° C. and a pressure equal to or greater than the critical pressure Pc of about 72.8 atm.

The supercritical fluid may be purified and reused. After the step S50, the supercritical fluid may be mixed with the wet cleaning agent and the etching agent. The mixture including the supercritical fluid, the wet cleaning agent, and the etching agent may be purified. The supercritical fluid may be purified and may be disposed on the substrate 10. The method of purifying the supercritical fluid will be described in more detail below.

Whether the manufacturing process of the substrate 10 is finished or not is judged (S60). If the manufacturing process is finished, a corresponding unit process may be ended. The manufacturing process may include a plurality of unit processes. The unit processes may be processes forming a semiconductor pattern, a dielectric pattern, a metal pattern, and/or an ion-implantation region in and/or on the substrate 10.

If the manufacturing process of the substrate 10 is not finished, the steps S10 to S60 may be repeatedly performed. The unit processes may be cleaned using the supercritical fluid S50.

The cleaning method using the supercritical fluid may increase surface characteristics of the substrate 10 as compared with a dry etching method such as an ashing process.

As described above, the supercritical fluid can remove the wet cleaning agent. The supercritical fluid may remove contaminants (e.g., particles). Thus, the cleaning method using the supercritical fluid may reduce impurities on the surface of the substrate 10. When the wet cleaning agent and the etching agent are removed from the mixture including the supercritical fluid, the supercritical fluid may be rotationally or repeatedly used.

Hereinafter, the method of purifying the supercritical fluid according to exemplary embodiments of the present inventive concept will be described in more detail with reference to FIG. 7.

Figure 7:
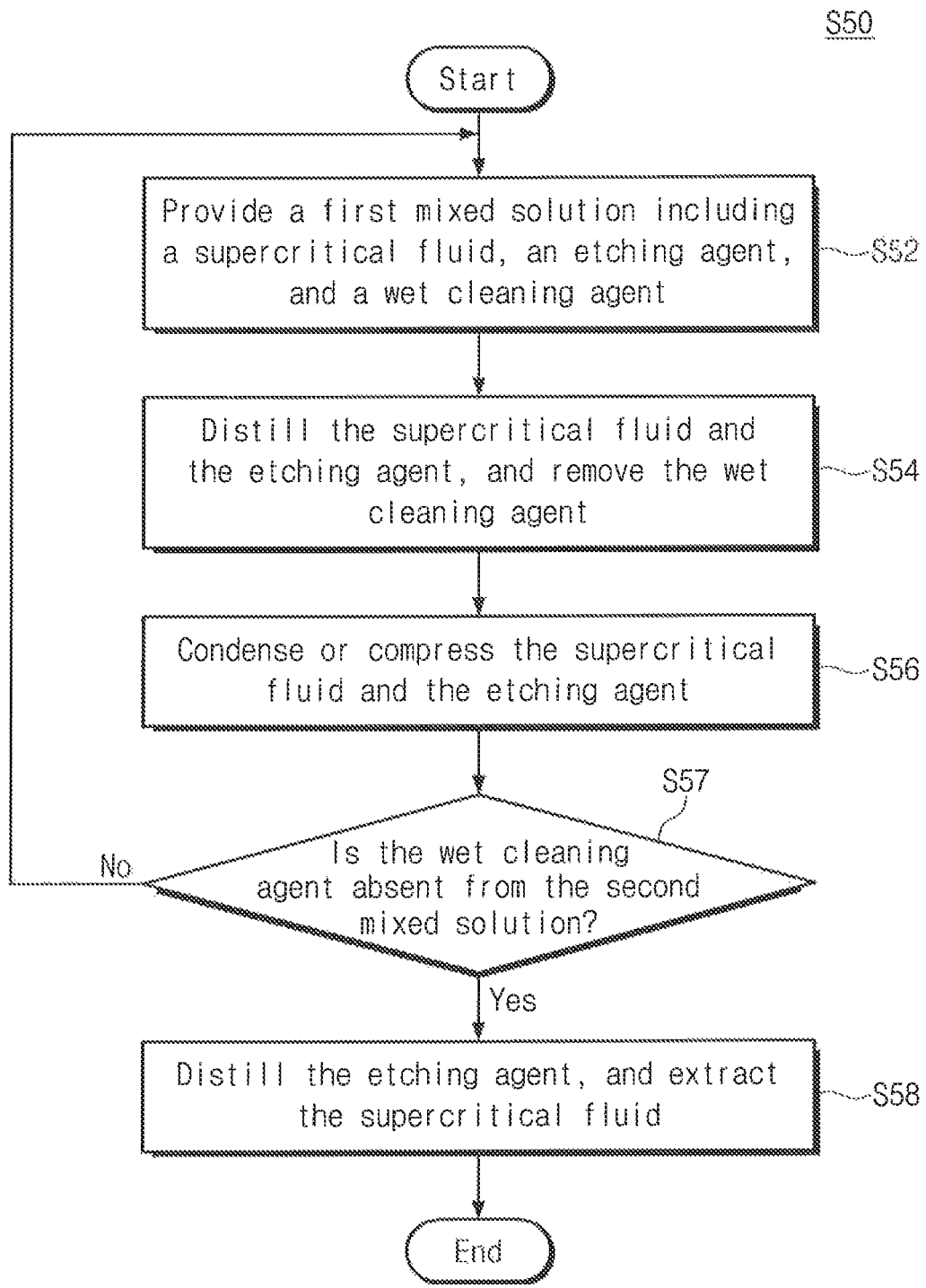
FIG. 7 is a flowchart illustrating a method of purifying a cleaning agent according to exemplary embodiments of the present inventive concept.

FIG. 7 is a flowchart illustrating a method of purifying a cleaning agent according to exemplary embodiments of the present inventive concept.

Figure 8:
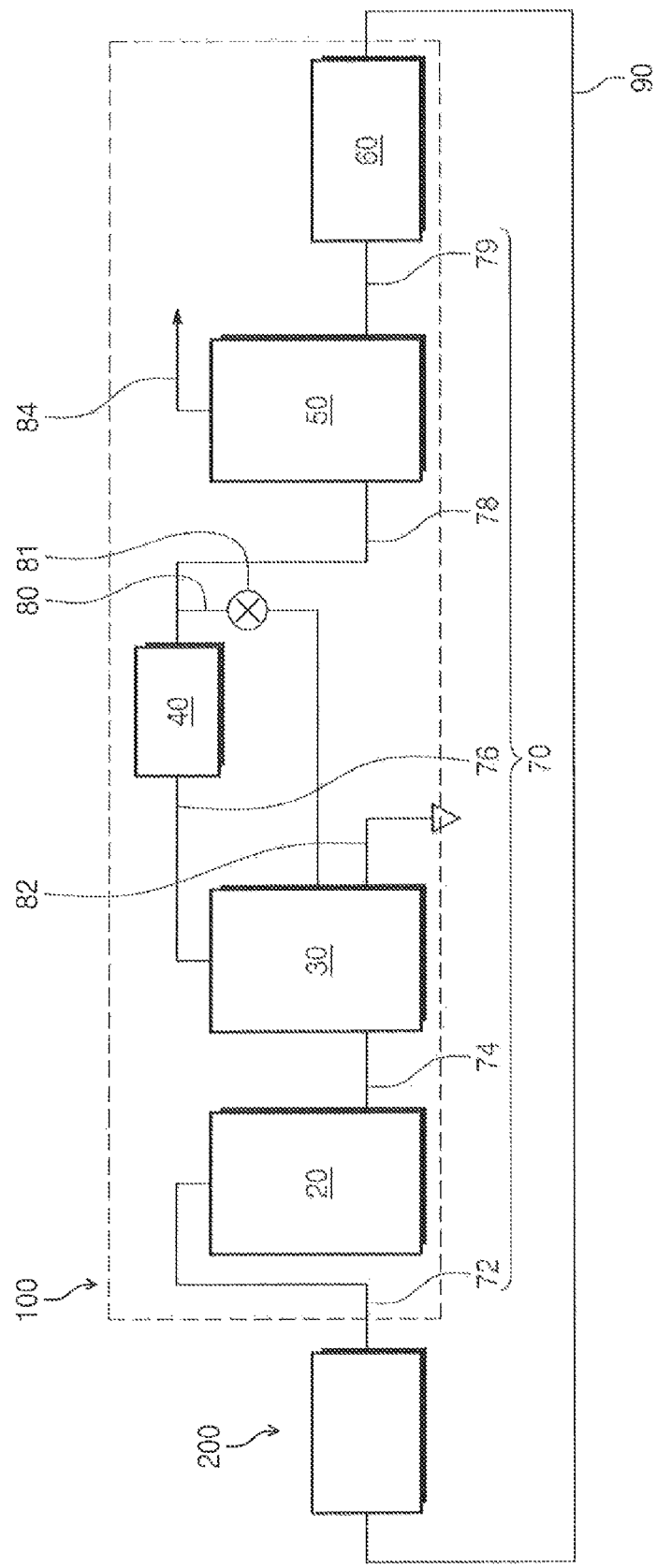
FIG. 8 illustrates an apparatus for purifying a cleaning agent according to exemplary embodiments of the present inventive concept.

Referring to FIG. 7, a first mixed solution including the supercritical fluid, the etching agent, and the wet cleaning agent may be provided from a cleaning apparatus 200 of FIG. 8 (S52). The first mixed solution may be at high temperature and high pressure.

The first mixed solution may be heated to distill the supercritical fluid and the etching agent and to remove the wet cleaning agent (S54). The supercritical fluid and the etching agent may have boiling points lower than that of the wet cleaning agent. According to exemplary embodiments of the present inventive concept, the first mixed solution may be heated at a temperature substantially equal to or lower than room temperature (e.g., 20° C.). According to exemplary embodiments of the present inventive concept, heat of a temperature higher than room temperature may be applied to the first mixed solution at high pressure.

The supercritical fluid and the etching agent may have boiling points equal to or lower than room temperature (e.g., 20° C.) at atmospheric pressure. For example, the boiling point of carbon dioxide may be about −56° C. The boiling point of hydrobromic acid (Hr) may be about −66° C. The boiling point of phosphine ($PH_3$) may be about −88° C. The boiling point of germane ($GeH_4$) may be about −88° C. The boiling point of methane ($CH_4$) may be about −88.6° C. The boiling point of diborane ($B_2H_6$) may be about −92.5° C. The boiling point of nitrogen tri-fluoride ($NF_3$) may be about −129° C.

The boiling point of the wet cleaning agent may be higher than room temperature at atmospheric pressure. For example, the boiling point of isopropyl alcohol may be about 79° C. The boiling point of acetone may be about 55° C. The boiling point of methanol may be about 65° C. The boiling point of ethanol may be about 78° C. The boiling point of ether may be about 35° C.

When the supercritical fluid and the etching agent are distilled, the wet cleaning agent may be in a liquid state. Thus, the wet cleaning agent may be removed along with contaminants such as particles from the supercritical fluid and the etching agent.

The distilled etching agent and supercritical fluid may be compressed or condensed (S56). Thus, the supercritical fluid and the etching agent may be converted into a second mixed solution. The pressure applied to the second mixed solution may be higher than the pressure applied to the first mixed solution.

Whether the wet cleaning agent is absent from the second mixed solution is determined (S57). If the wet cleaning agent remains in the second mixed solution, the second mixed solution may be re-purified. The wet cleaning agent in the second mixed solution may be detected by a sampling method. The sampling method may confirm whether the wet cleaning agent is present in the second mixed solution or not. According to an exemplary embodiment of the present inventive concept, whether the wet cleaning agent is present in the second mixed solution or not may be confirmed by evaluating photoresist solubility of the second mixed solution.

If the wet cleaning agent remains in the second mixed solution, the second mixed solution may be returned to the step S52. The second mixed solution may be re-purified through the steps S52, S54, and S56.

If the wet cleaning agent does not remain in the second mixed solution, the etching agent may be distilled and the supercritical fluid may be extracted (S58). The supercritical fluid may have a higher boiling point than that of the etching agent. Thus, the supercritical fluid may be in a liquid state when the etching agent is in a gaseous state. The etching agent may be distilled to extract the supercritical fluid.

If a low-purity supercritical fluid is found during or after the cleaning process using the supercritical fluid, re-purification of the second mixed solution may be performed (S57). If the wet cleaning agent remains in the second mixed solution, the purity of the supercritical fluid may be reduced after the etching agent is distilled. The purity of the supercritical fluid may be measured at predetermined time points or as otherwise needed when the cleaning processes using the supercritical fluid is performed. If the purity of the supercritical fluid is reduced, the second mixed solution may be re-purified through the steps S52, S54, and S56.

As a result, supercritical fluid with increased purity may be provided by the method of purifying the supercritical fluid described above.

The above method of purifying the supercritical fluid has been described in accordance with exemplary embodiments of the present inventive concept. However, exemplary embodiments of the present inventive concept are not limited thereto. For example, the purifying method according to an exemplary embodiment of the present inventive concept may be modified to be applied to materials corresponding to the supercritical fluid.

An apparatus for performing the purifying method described above will be described with reference to FIG. 8 hereinafter.

FIG. 8 illustrates an apparatus 100 for purifying a cleaning agent according to exemplary embodiments of the present inventive concept.

Referring to FIG. 8, the apparatus 100 according to an exemplary embodiment of the present inventive concept may include a buffer tank 20, a first distillation tower 30, a compressor 40, a second distillation tower 50, an absorption unit 60, a main purification pipe 70, an assistant purification pipe 80, and a withdraw pipe 90.

The buffer tank 20 may temporarily store the first mixed solution. The first mixed solution may be received from the cleaning apparatus 200 including the supercritical fluid. The cleaning apparatus 200 may compress the supercritical fluid, the etching agent, and the wet cleaning agent and may form the first mixed solution. The buffer tank 20 may convey the first mixed solution to the first distillation tower 30.

The main purification pipe 70 may connect the buffer tank 20, the first distillation tower 30, the compressor 40, the second distillation tower 50, and the absorption unit 60 to each other. The buffer tank 20, the first distillation tower 30, the compressor 40, the second distillation tower 50, and the absorption unit 60 may be connected to each other in the order named. For example, the main purification pipe 70 may include first to fifth main pipes 72, 74, 76, 78, and 79.

The first main pipe 72 may be connected between the buffer tank 20 and the cleaning apparatus 200. The first mixed solution may be conveyed through the first main pipe 72. The second main pipe 74 may be connected between the buffer tank 20 and the first distillation tower 30. The first mixed solution may be conveyed through the second main pipe 74. The third main pipe 76 may be connected between the first distillation tower 30 and the compressor 40. The etching agent may be in the gaseous state and the supercritical fluid may be conveyed through the third main pipe 76. The fourth main pipe 78 may be connected between the compressor 40 and the second distillation tower 50. The second mixed solution may be conveyed through the fourth main pipe 78. The fifth main pipe 79 may be connected between the second distillation tower 50 and the absorption unit 60. The supercritical fluid in the liquid state may be conveyed through the fifth main pipe 79.

The second main pipe 74 may be connected to a lower portion of the first distillation tower 30. The first distillation tower 30 may heat the first mixed solution and may remove the wet cleaning agent from the supercritical fluid and the etching agent. According to exemplary embodiments of the present inventive concept, the first mixed solution may be heated at a temperature substantially equal to or lower than room temperature. The first distillation tower 30 may distill the supercritical fluid and the etching agent. For example, carbon dioxide of the supercritical fluid may evaporate at about −56.6° C. under atmospheric pressure and may evaporate at a temperature higher than about −56.6° C. under a pressure higher than atmospheric pressure. The etching agent may evaporate at a temperature lower than an evaporation temperature of the supercritical fluid. A boiling point of the wet cleaning agent may be lower than boiling points of the supercritical fluid and the etching agent, and the wet cleaning agent may be in a liquid state in the first distillation tower 30.

A first drain pipe 82 may be connected to the lower portion of the first distillation tower 30. The wet cleaning agent in the liquid state may be removed from the first distillation tower 30 through the first drain pipe 82. The wet cleaning agent may be drained to an outside of the purification apparatus 100.

The third main pipe 76 may be connected to an upper portion of the first distillation tower 30. The supercritical fluid and the etching agent may flow through the third main pipe 76. The supercritical fluid and the etching agent may be in the gaseous state. The third main pipe 76 may have a diameter greater than that of the second main pipe 74. The third main pipe 76 having the greater diameter may convey the supercritical fluid and the etching agent in the gaseous state.

The compressor 40 may compress the supercritical fluid and the etching agent in the gaseous state and may convert the supercritical fluid and the etching agent to the liquid state. The supercritical fluid and the etching agent may be converted into the second mixed solution by the compressor 40.

The fourth main pipe 78 may convey the second mixed solution to the second distillation tower 50. The fourth main pipe 78 may be connected to a lower portion of the second distillation tower 50. The second mixed solution may be at a pressure higher than the pressure of the supercritical fluid and the etching agent in the gaseous state.

The assistant purification pipe 80 may be branched off the fourth main pipe 78 and may be connected to the lower portion of the first distillation tower 30. The assistant purification pipe 80 may convey a portion of the second mixed solution to the first distillation tower 30. The assistant purification pipe 80 may include a reflux pipe. The first distillation tower 30 may re-purify the supercritical fluid and the etching agent, and may increase the purity of the supercritical fluid and the etching agent.

A reflux control valve 81 may be disposed on the assistant purification pipe 80. The reflux control valve 81 may switch the direction of the second mixed solution in the assistant purification pipe 80. For example, if the reflux control valve 81 is closed, substantially an entire portion of the second mixed solution may be conveyed to the second distillation tower 50, if the reflux control valve 81 is opened, a portion or substantially an entire portion of the second mixed solution may be conveyed to the first distillation tower 30. The reflux control valve 81 may be turned-on or turned-off by a control signal of a control unit (not shown). For example, if the purity of the supercritical fluid is reduced or the wet cleaning agent exists in the second mixed solution, the reflux control valve 81 may be turned-on.

The second distillation tower 50 may distill the etching agent and may extract the supercritical fluid in the liquid state. The etching agent may evaporate at the temperature lower than the evaporation temperature of the supercritical fluid. The second distillation tower 50 may heat the second mixed solution at the temperature which is lower than the boiling point of the supercritical fluid and may be substantially equal to or greater than the boiling point of the etching agent.

For example, hydrobromic acid (HBr) may evaporate at a temperature substantially equal to or greater than about −66° C. under atmospheric pressure and may evaporate at a temperature higher than the evaporation temperature at atmospheric pressure when under a pressure higher than atmospheric pressure. The supercritical carbon dioxide of the supercritical fluid may be in the liquid state in the second distillation tower 50 when hydrobromic acid (HBr) evaporates.

The etching agent may be exhausted through a second drain pipe 84. The second drain pipe 84 may be connected to an upper portion of the second distillation tower 50. The second drain pipe 84 may be connected to a scrubber (not shown).

The supercritical fluid may be extracted from the lower portion of the second distillation tower 50. The supercritical fluid may flow through the fifth main pipe 79. The purification apparatus 100 according to an exemplary embodiment of the present inventive concept may purify the supercritical fluid and may increase the purity of the supercritical fluid.

The supercritical fluid may be conveyed to the absorption unit 60. The absorption unit 60 may absorb and remove impurities or contaminants from the supercritical fluid. The absorption unit 60 may include active carbon, diatomite, zeolite, silica gel, and/or alumina.

The withdraw pipe 90 may be connected from the absorption unit 60 to the cleaning apparatus 200. The withdraw pipe 90 may convey the purified supercritical fluid to the cleaning apparatus 200.

According to exemplary embodiments of the present inventive concept, the first mixed solution of the supercritical fluid, the wet cleaning agent, and the etching agent may be heated to distill the supercritical fluid and the etching agent and to remove the wet cleaning agent. The supercritical fluid and the etching agent may be compressed and the second mixed solution may be formed. The second mixed solution may be heated to distill the etching agent and extract the supercritical fluid.

As a result, supercritical fluid with increased purity may be provided by the purifying method according to exemplary embodiments of the present inventive concept.

While the inventive concept has been particularly shown and described with reference to exemplary embodiments thereof, it will be understood by those of ordinary skill in the art that various changes in form and detail may be made therein without departing from the spirit and scope of the present inventive concept.

What is claimed is:

1. A method of purifying a cleaning agent, the method comprising:
heating a first mixed solution including an etching agent comprising a hydrobromic acid, a first cleaning agent comprising supercritical carbon dioxide, and a second cleaning agent at or below a first temperature and distilling the etching agent and the first cleaning agent and removing the second cleaning agent, wherein a first pressure is applied to the first mixed solution to maintain a supercritical state of the supercritical carbon dioxide;

condensing the etching agent and the first cleaning agent forming a second mixed solution including the etching agent and the first cleaning agent; and heating the second mixed solution at a temperature lower than a second temperature, redistilling the etching agent and extracting the first cleaning agent, wherein the second temperature is lower than the first temperature, and wherein a second pressure is applied to the second mixed solution to maintain the supercritical state of the supercritical carbon dioxide.

2. The method of claim 1, wherein the etching agent includes a wet etching agent or dry etching agent, and wherein boiling points of the wet etching agent or dry etching agent are lower than that of the supercritical fluid.

3. The method of claim 2, wherein the dry etching agent includes phosphine, germane, methane, diborane, or nitrogen tri-fluoride.

4. The method of claim 1, wherein the second cleaning agent includes a wet cleaning agent having a boiling point higher than that of the supercritical carbon dioxide, and
wherein the wet cleaning agent includes an organic solvent.

5. The method of claim 4, wherein the organic solvent includes isopropyl alcohol.

6. The method of claim 1, further comprising:
after heating the second mixed solution at the temperature lower than the second temperature, performing a sampling method to determine whether a fractional amount of the second cleaning agent remains in the second mixed solution; and
when the fractional amount of the second cleaning agent is determined to remain in the second mixed solution, heating the second mixed solution at or below the first temperature and distilling the etching agent and the first cleaning agent of the second mixed solution and removing the fractional amount of the second cleaning agent from the second mixed solution.

7. The method of claim 1, wherein the first temperature is lower than a boiling point of the second cleaning agent.

8. The method of claim 1, wherein the second temperature is a boiling point of the first cleaning agent.

9. The method of claim 1, wherein the first pressure is different from the second pressure.

10. The method of claim 9, wherein the second pressure is higher than the first pressure.

11. A method of purifying a cleaning agent, the method comprising:
heating a first mixed solution including an etching agent comprising a hydrobromic acid, a first cleaning agent comprising supercritical carbon dioxide, and a second cleaning agent at or below a first temperature and distilling the etching agent and the first cleaning agent and removing the second cleaning agent, wherein a first pressure is applied to the first mixed solution to maintain a supercritical state of the supercritical carbon dioxide;
condensing the etching agent and the first cleaning agent forming a second mixed solution including the etching agent and the first cleaning agent; and
heating the second mixed solution at a temperature lower than a second temperature, redistilling the etching agent and extracting the first cleaning agent, wherein the second temperature is lower than the first temperature and an evaporation temperature of the first cleaning agent of the supercritical fluid, and wherein a second pressure is applied to the second mixed solution to maintain the supercritical state of the supercritical carbon dioxide.

12. The method of claim 11, wherein the first pressure is different from the second pressure.

13. The method of claim 12, wherein the second pressure is higher than the first pressure.

* * * * *